United States Patent [19]

Pfeiffer et al.

[11] 3,894,271

[45] July 8, 1975

[54] METHOD AND APPARATUS FOR ALIGNING ELECTRON BEAMS

[75] Inventors: Hans C. Pfeiffer, Ridgefield, Conn.; Ollie C. Woodard, Poughkeepsie, N.Y.

[73] Assignee: International Business Machines Corporation, Armonk, N.Y.

[22] Filed: Aug. 31, 1973

[21] Appl. No.: 393,365

[52] U.S. Cl. .......................... 315/384; 219/121 EB

[51] Int. Cl. .......................... H01j 29/52; B23k 9/00

[58] Field of Search .................. 315/31 R, 365, 384; 250/396–398, 492 A, 306, 307, 310, 311; 219/121 EB

[56] References Cited

UNITED STATES PATENTS

| | | | |
|---|---|---|---|
| 2,627,589 | 2/1953 | Ellis | 250/310 |
| 3,644,700 | 2/1972 | Kruppa et al. | 250/492 A |
| 3,699,304 | 10/1972 | Baldwin, Jr. et al. | 250/396 |
| 3,745,358 | 7/1973 | Firtz et al. | 250/397 |

*Primary Examiner*—Maynard R. Wilbur
*Assistant Examiner*—T. M. Blum
*Attorney, Agent, or Firm*—Sughrue, Rothwell, Mion, Zinn and Macpeak

[57] ABSTRACT

A square-shaped electron beam is stepped from one predetermined position to another to form a desired pattern on each chip of a semiconductor wafer to which the beam is applied. During various times, e.g., the target stage is moving mechanically from one chip to the next one, the electron beam is blanked. The blanking aperture plate in the electron beam column is provided with a second sensing aperture. During a blanked phase, the condensor lens images the electron source on the sensing aperture of the blanking aperture plate. A sensing plate disposed beneath the blanking aperture monitors the beam current and provides a signal to an alignment servo. Error correction is carried out by moving the beam in small increments in two orthogonal directions until the sensing plate reads a maximum current.

17 Claims, 6 Drawing Figures

METHOD AND APPARATUS FOR ALIGNING ELECTRON BEAMS

BACKGROUND OF THE INVENTION

1. Field of the Invention

The present invention generally relates to a method and apparatus for controlling an electron beam, and more particularly to an alignment servo for electron beams which eliminates instabilities due to lateral beam drift without interfering with the normal mode of operation. The invention has particular application in apparatus employed to expose the resist on the chips of semiconductor wafers in the manufacturing process of various kinds of semiconductor devices.

2. Description of the Prior Art

In the manufacture of semiconductors, minute and very accurate patterns must be formed in the resist on the surface of the semiconductor material. In the past, it has been known to use a mask to form a pattern in the resist. Such a mask must be accurate and capable of reproducing the same pattern many times without any significant deviations therefrom. The process for making such a mask is relatively expensive and time consuming.

In the patent to Kruppa et al, U.S. Pat. No. 3,644,700, there is disclosed a method and apparatus which utilizes an electron beam to expose the resist directly thereby eliminating the requirement for the formation of any mask and the attendant problems associated therewith. In the Kruppa et al system, a beam of charged particles is moved in a substantially raster fashion so that any point within the field to which the beam is applied is always reached by the same history. To extend the accuracy of the position of the beam beyond short term repeatability that is obtained through moving the beam in a substantially raster fashion, a known target is periodically scanned by the beam and errors between the positions of the target and the beam are ascertained. Any corrections are applied to a second deflection circuit for the beam so as not to disrupt the history of the beam that is obtained by moving it in the substantially raster fashion. To insure that the patterns formed by the beam are sharp and that the width of each line of the pattern is controlled to its desired size, the beam is stepped from one predetermined position to another in forming the desired pattern. In this manner, the full energy of the beam is applied to each of the predetermined positions in accordance with the desired pattern to insure that there is sufficient energy to expose the resist. To assure that the pattern exposed on the resist is sharply defined, a known target, which may be a separate and distinct target or the same target used to determine beam position errors, is periodically scanned by the beam to detect the focus of the beam.

While the Kruppa et al system is less expensive and produces higher yields in a shorter period of time than presently available methods of masking in some situations, some instability of the electron beam has been encountered from time to time. The instability of the electron beam is manifested in a lateral beam drift caused by mechanical, thermal or electrostatic influences. The effect of these influences, i.e., lateral beam drift, is one of the basic limitations for the stability of all electron optical instruments.

SUMMARY OF THE INVENTION

It is therefore an object of the present invention to provide a method of eliminating the instabilities due to lateral beam drift in electron optical instruments.

It is another object of the invention to provide an apparatus for automatically aligning the electron beam in an electron optical instrument to eliminate lateral beam drift caused by mechanical, thermal or electrostatic influences.

It is a further object of this invention to provide, within a system which utilizes an electron beam to directly expose the resist on a semiconductor wafer in the process of manufacturing semiconductor devices, an alignment servo for maintaining the electron beam centering over the blanking aperture.

According to the present invention the foregoing and other objects are attained by modifying the blanking aperture in an electron beam column to provide another aperture for alignment. This allows the servo action to take place without turning on the electron beam. A sensing plate with an aperture in alignment with the primary aperture of the blanking plate intercepts the electron beam for measurement when it passes through the alignment aperture. The primary and secondary aperture plates are separated by a very thin insulator to avoid charging problems. When the electron beam is turned off, the source image is deflected to the sensing aperture, and the beam current is monitored at the sensing plate. The deflection from the center to the sensing position requires a defined deflection signal which remains constant. A beam misalignment at the center results in an equivalent misalignment at the sensing aperture. The error correction is carried out by moving the beam in small increments alternating in two orthogonal directions until the sensing plate reads maximum current. Subsequently, the constant deflection signal is subtracted when the beam is turned on, and the beam is aligned at the center aperture. This operation has the advantages that the corrections do not require additional time and they can be carried out without interfering with the pattern generation at the target.

BRIEF DESCRIPTION OF THE DRAWINGS

The specific nature of the invention, as well as other objects, aspects, uses and advantages thereof, will clearly appear from the following description and from the accompanying drawings, in which.

DETAILED DESCRIPTION OF THE INVENTION

Figure 1:
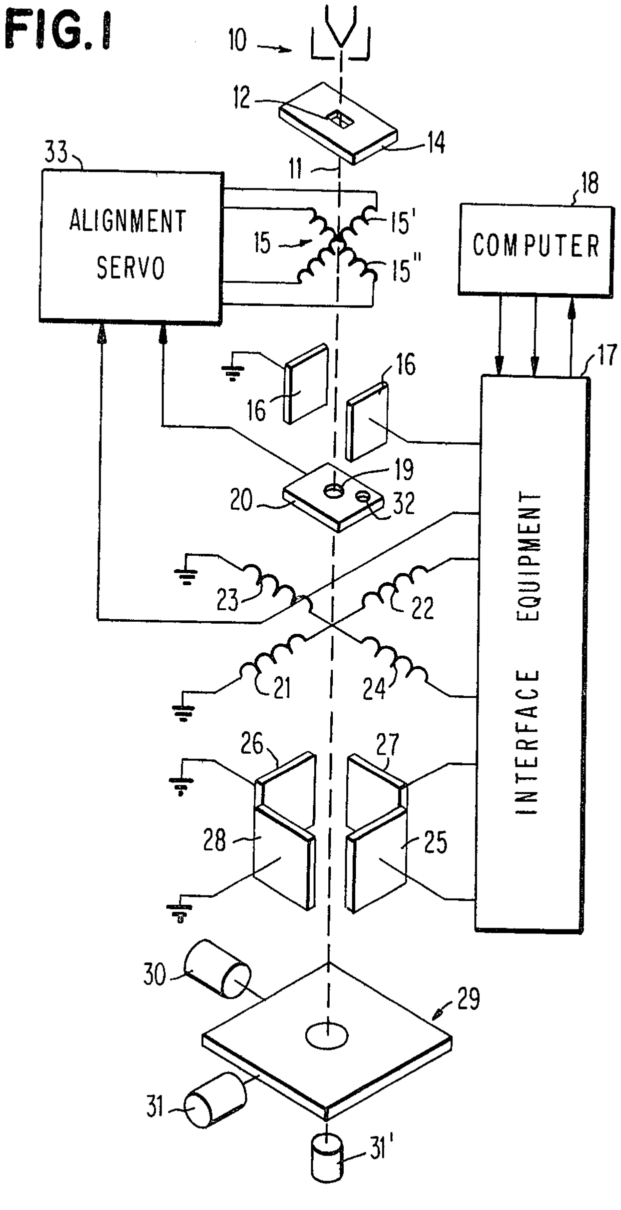
FIG. 1 is a schematic view showing the apparatus of the present invention incorporated into an electron beam column.

Referring to the drawings and particularly to FIG. 1, there is shown an electron gun 10 for producing a beam 11 of charged particles in the well known manner. The electron beam 11 is passed through an aperture 12 in a plate 14 to shape the beam 11. The beam 11 is preferably square shaped and has a size equal to the minimum line width of the pattern that is to be formed.

The beam 11 passes through an alignment yoke 15 and then between a pair of blanking plates 16, which determine when the beam is applied to the material and when the beam is blanked. The blanking plates 16 are controlled from circuits, which form part of the interface equipment 17. The interface equipment 17 is connected to a computer 18, which is preferably an IBM 1800 computer. The computer 18 controls the deflection of the electron beam 11 through the interface equipment 17 in a manner which will become apparent in the following description.

The electron beam 11 then passes through a circular aperture 19 in the blanking plate 20. This controls the beam 11 so that only the charged particles passing through the centers of the lenses (not shown) are used so that a square shaped spot without any distortion is produced.

The beam 11 is next directed between magnetic deflection coils 21, 22, 23 and 24. The magnetic deflection coils 21 and 22 control the deflection of the electron beam 11 in a horizontal or X direction while the magnetic deflection coils 23 and 24 control the deflection of the beam 11 in a vertical or Y direction. Accordingly, the coils 21 to 24 cooperate to move the beam 11 in a substantially raster fashion by appropriately deflecting the beam 11.

The beam 11 then passes between electrostatic deflection plates 25, 26, 27 and 28. The plates 25 and 26 cooperate to deflect the beam in the horizontal or X direction while the electrostatic plates 27 and 28 cooperate to move the beam 11 in the vertical or Y direction. The plates 25 to 28 are employed to correct the position of the beam 11 without affecting the history of its movement in the substantially raster fashion by the magnetic deflection coils 21 to 24.

The beam 11 is then applied to a taget, which is supported on a table 29. The table 29 is moved in the horizontal or X direction by a stepping motor 30, in the vertical or Y direction by a stepping motor 31, and in a direction parallel to the beam travel or the Z direction by a stepping motor 31'. The stepping motors 30, 31 and 31' have their movements controlled by the computer 18.

As previously mentioned, the beam 11 is always moved in the same manner by the magnetic deflection coils 21 to 24 so as to not affect the history of its movement in a substantially raster fashion. Accordingly, the movement of the beam 11 by the magnetic deflection coils 21 to 24 is in an A cycle, a B cycle, and a C cycle. After each C cycle is completed, the sequence begins again with the A cycle. Thus, as long as the beam 11 is activated, it operates continuously in the same sequence. Furthermore, the beam 11 is blanked during some or all of the A, B and C cycles depending on the particular operation that is being accomplished. All of these various sequences in which none, one, two or all of the A, B and C cycles is blanked is controlled by cooperation between the computer 18 and the interface 17.

In operation, a focus operation is the first requirement. This checks the focus of the beam including its astigmatism. This is accomplished through using only the C cycle. During the A and B cycles in the focus operation, the beam 11 is blanked by the control of the computer 18 through the interface equipment 17.

After the beam 11 has been properly focused, the calibration operation occurs. During calibration, the beam 11 is operated only in the B cycle with the A and C cycles being blanked so that the error in deflection in the beam 11 during the B cycle is determined. These errors are first determined by the deflection of the beam 11 in the X or horizontal direction and then are determined in the vertical or Y direction.

After the deflection errors for the beam 11 in both the X and Y directions have been determined, the beam 11 is operated only in the A cycle in both the X and Y directions. Then, the beam 11 is again operated in the B cycle to determine the correlation in the vertical and horizontal directions of the beam 11 between the A cycle and the B cycle.

The foregoing operations result in the beam 11 being focused and calibrated properly. Then, the beam 11 may be used in the registration operation and subsequently to expose resist on semiconductor wafer chips.

In the registration operation, only the A cycle is initially employed to locate two diametrically exposed wafer registration marks on a semi-conductor wafer while the B and C cycles are blanked. Then, an A cycle is used to locate registration marks associated with a chip which is to have its resist exposed. During the B cycle following the A cycle, the resist is exposed. During the C cycle, the beam 11 is blanked, and the semiconductor wafer on the table 29 is moved by moving the table 29 to position another of the chips on the semiconductor wafer at the position in which the beam 11 may be applied thereto.

It is during this latter C cycle when the semiconductor wafer on table 29 is being moved to position another chip for exposure, that the alignment servo of the present invention is operable. According to the invention, a second auxiliary aperture 32 is provided in the blanking plate 20. Aperture 32 is the focusing aperture, and there is provided a sensing plate 34, illustrated more fully in FIG. 2, which senses the beam current passing through the focusing aperture. The beam current monitored by the sensing plate is supplied as one input to the alignment servo 33. The timing and operation of the alignment servo 33 is controlled by the interface equipment 17 which provides information including the timing of the C cycle. The alignment servo is connected to the deflection yoke 15 which includes orthogonal coils 15' and 15''. Error correction by the alignment servo 33 is carried out by moving the beam in small increments alternating in the X direction through winding 15' and then the Y direction through winding 15''.

Figure 2:
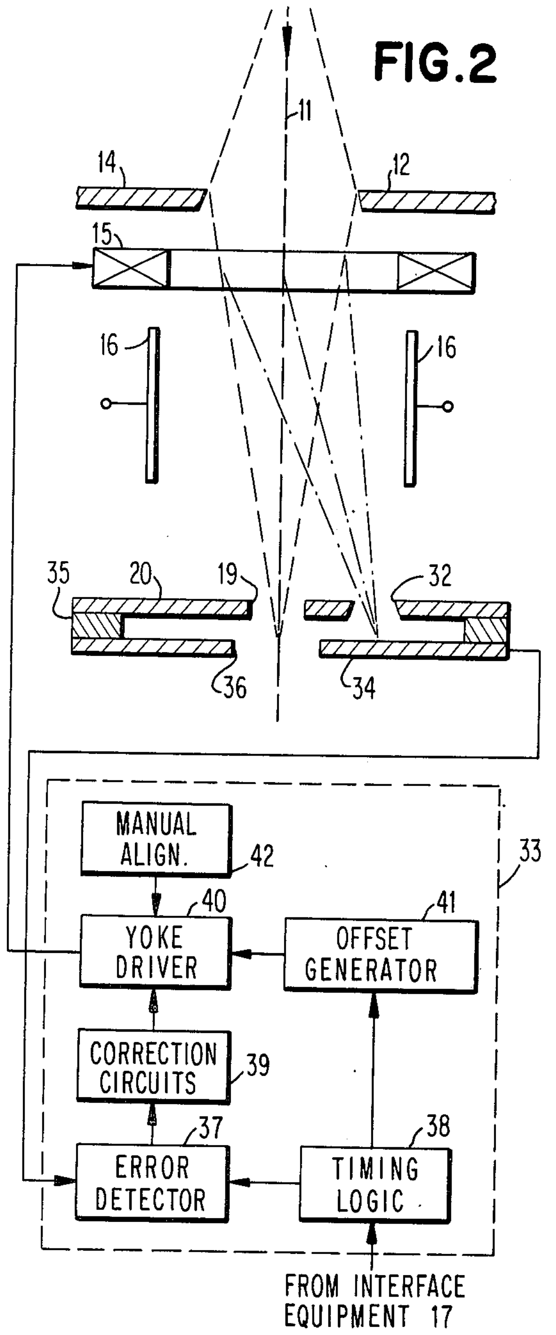
FIG. 2 is a partially schematic and partially block diagram which illustrates the basic principle of the invention.

FIG. 2 shows schematically in cross-section the modification of the electron beam column according to the invention. The electron beam 11 passes through the shaping aperture 12 in the plate 14 and the condensor lens (not shown). The beam 11 then passes through the alignment yoke 15 and between the blanking electrostatic deflection plates 16.

The beam 11 then passes through the aperture 19 in the blanking plate 20. The blanking plate 20 is provided with an auxiliary or focusing aperture 32 positioned to the side of the normal blanking aperture 19. Fixed offsets in two orthogonal directions are switched in during alignment to position the electron beam 11 over the alignment aperture 32.

A sensing plate 34 is positioned just below the blanking plate 20 and spaced apart therefrom by a thin disc 35 of mica or other good insulator. The disc 35 is very thin to avoid any charging problems. The sensing plate 34 is provided with a central aperture 36 which is larger than the aperture 19 in the blanking plate 20 so that the sensing plate 34 will not interfere with the normal operation of the electron beam 11.

The current collected by the sensing plate 34 below the alignment aperture 32 is maximum when the beam 11 is centered. This is because a beam misalignment at the center or aperture 19 results in an equivalent misalignment at the sensing aperture 32.

The current monitored by the sensing plate 34 is provided as a signal to the error detector 37 in the alignment servo 33. The error detector 37 is controlled by timing logic 38 which is controlled by computer 18 through interface equipment 17. The alignment servo 33 will operate each C cycle except when a focus operation is performed. The time allowed for alignment is therefore limited to the C cycle. In the present system, one half second is required for motor stepping and setting. This allows ample time for several operations. In addition, it does not matter if the current is not fully corrected in one C cycle, since the process will continue in the next C cycle. For this reason, the alignment servo 33 will be operated slowly allowing narrow bandwidths to circumvent any noise problems which might otherwise occur.

The error signal output from error detector 37 is provided to the correction circuits 39 which in turn generate correction signals to the yoke driver 40. Yoke driver 40 also receives an input from the offset generator 41. Offset generator 41 is controlled by the timing logic 38 and provides the fixed d.c. offset voltages which cause the beam 11 to be positioned over the alignment aperture. Yoke driver 40 also receives a signal from the manual alignment pot 42. The pot 42 is on the operating panel and is used to set the center aperture position.

Figure 3:
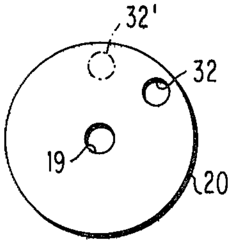
FIG. 3 is a planar view of the blanking aperture plate showing the auxiliary alignment aperture and the normal blanked position of the electron beam.

Referring to FIG. 3, the blanking plate 20 with the aperture 19 is shown in planar view. The position 32' to one side of the aperture 19 indicated by dash-dot circle is the normal blanked position of the electron beam. The alignment aperture 32 is also positioned to one side of the center aperture 19 but offset from the normal blanked position 32'. Deflection of the electron beam 11 to the blanked position 32' is caused by the electrostatic deflection plates 16 acting alone. The deflection of the electron beam 11 with the fixed offset to position the beam over the alignment aperture 32 is accomplished under the combined action of the electrostatic deflection plate 16 and the alignment yoke 15 in response to fixed offset voltage signals from the offset generator 41.

Figure 4:
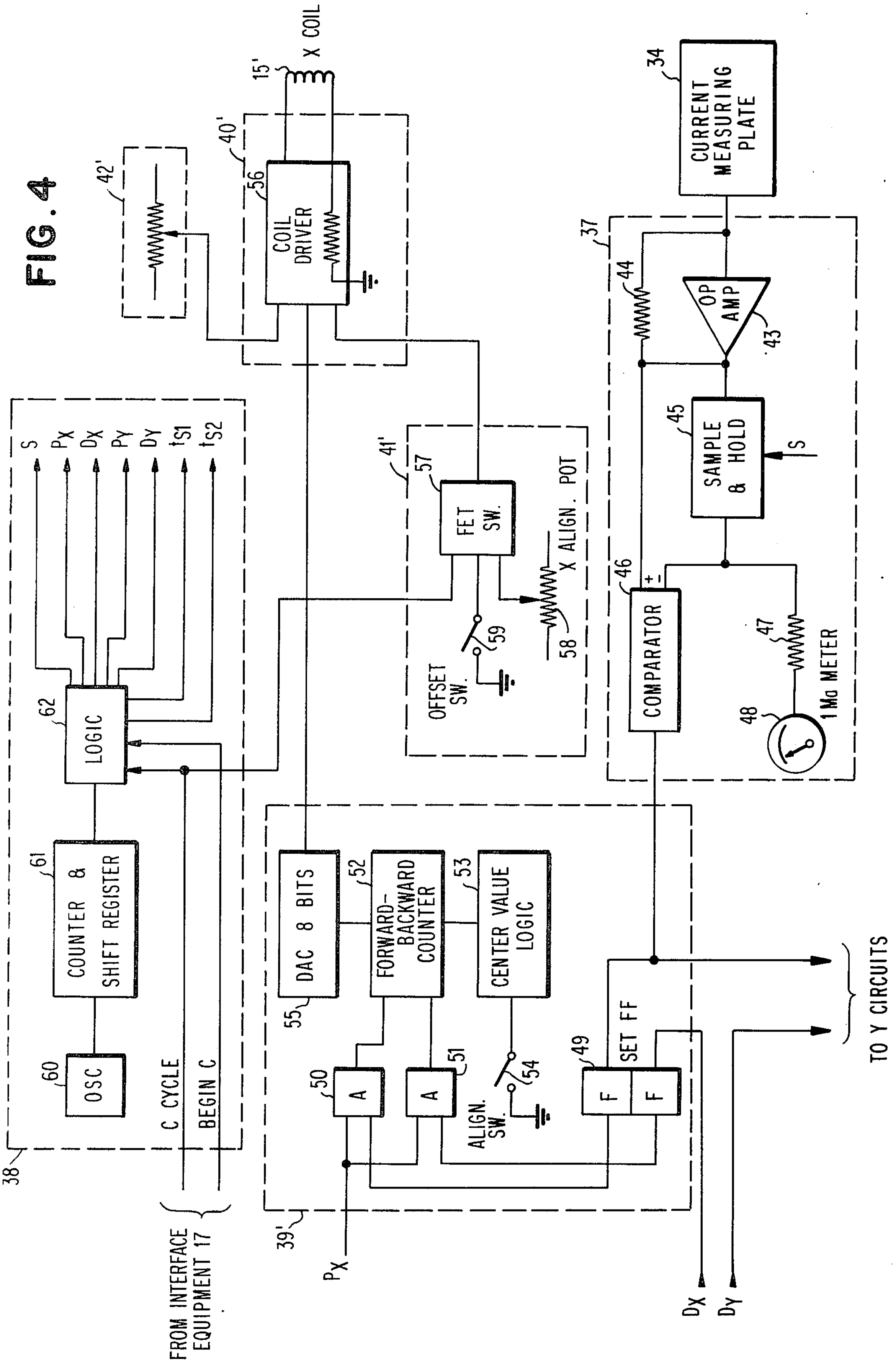
FIG. 4 is a schematic diagram of a digital servo which may be used to implement the present invention.

A digital implementation of the alignment servo 33 is illustrated in FIG. 4. Current measuring plate 34 is connected to the input of an operational amplifier 43 having a feedback resistor 44 which determines the gain of the operational amplifier. The output of the operational amplifier is connected to a sample and hold circuit 45 and a comparator 46. The sample and hold circuit 45 is controlled by a timing pulse designated by the letter S and illustrated in FIG. 5. The timing pulse is generated by the timing logic 38. The output of the sample and hold circuit 45 is connected to the other input of comparator 46 and also through a resistor 47 to a current measuring device 48.

When a sample pulse S is generated by the timing logic 38, the sample and hold circuit is gated open to sample the current monitored by the current measuring plate 34. After the sampling period, the yoke driver 40 causes the beam 11 to be stepped in the X direction, for example, causing the current monitored by the current measuring plate 34 to change slightly. As a result, the signal representing the new current is supplied to the first input of comparator 46 from the operational amplifier 43, while a signal representing the just-preceding current is supplied to the second input of comparator 46 from the sample and hold circuit 45. Comparator 46 then generates a difference or error signal which is supplied to the correcting circuits 39. The current measurement displayed by the measuring device 48 is useful in manual alignment procedures as will become more clear as the description of the servo progresses.

The correction circuits 39 actually comprise separate but identical correction circuits for the othogonal X and Y directions. In order to simplify the drawing, only the X correction circuits 39' are illustrated in FIG. 4 of the drawing. It will be understood, however, that an identical Y correction circuit must also be provided.

Figure 5:
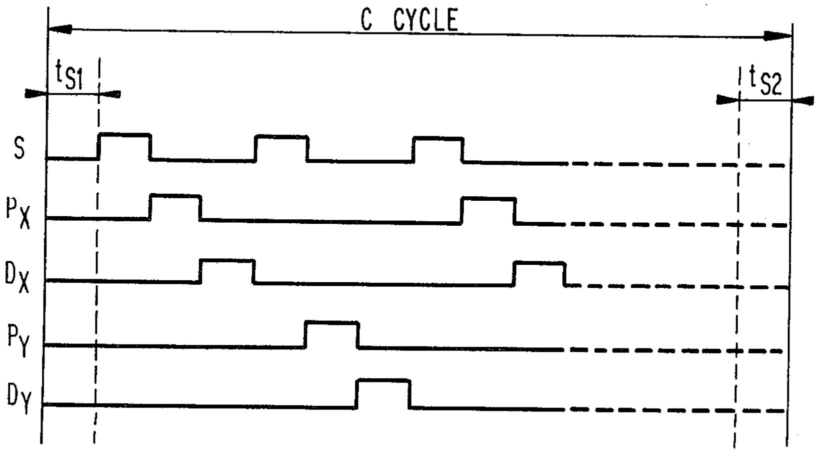
FIG. 5 is a timing diagram illustrating the sequence of operations in the digital servo shown in FIG. 4.

If the output of comparator 46 is positive indicating an increase of current monitored by the current measuring plate 34, flip-flop 49 will be set, otherwise flip-flop 49 is reset by the pulse $D_x$. The timing of the $D_x$ pulse which is generated by the timing logic 38 is illustrated in FIG. 5. The effect of setting or resetting the flip-flop 49 is to determine the direction of the incrementing of the position of the electron beam 11 in the X direction. Thus, the true output of flip-flop 49 enables AND gate 50, whereas the not true output of flip-flop 49 enables AND gate 51. Both of AND gates 50 and 51 receive a stepping pulse $P_x$ from the timing logic 38. The outputs of AND gates 50 and 51 are connected to a forward-backward counter 52. If AND gate 50 is enabled by flip-flop 49, the forward-backward counter 52 counts up in response to stepping pulses $P_x$. On the other hand, if AND gate 51 is enabled, counter 52 counts down in response to stepping pulses $P_x$.

Forward-backward counter 52 is initially set to a predetermined count by the center value logic 53 under the control of alignment switch 54. This allows the initial setup of the center position and alignment position.

The outputs of forward-backward counter 52 are connected to a digital to analog converter 55. This converter generates an analog output voltage which is proportional to the digital count in counter 52. Thus, the analog output voltage from the digital to analog converter 55 is the X position correction voltage which is supplied to the yoke driver 40.

FIG. 5 illustrates the sequence of the timing pulses which control the error detector 37 and the correction circuits 39 just described. As illustrated, the alignment procedure is carried out during a C cycle. The first sample pulse S is delayed by a time $T_{st}$ at the beginning of the C cycle to allow the beam to settle over the alignment aperture. After the first sample pulse S, a stepping pulse $P_x$ causes the forward-backward counter 52 to count either up or down depending upon the state of flip-flop 49. This causes a resultant incremental step in the X direction in the position of the electron beam 11. Immediately after the step pulse $P_x$, a sample pulse $D_x$ causes flip-flop 49 to assume its reset state unless the output of comparator 46 is positive. On the next sample pulse S, the same process is repeated except that this time the stepping and sampling is in the Y direction. On the third sample pulse S, the procedure is again repeated for the X direction and so on with the odd numbered sample pulses controlling the error correction signals in the X direction and the even numbered sample pulses S controlling the error correction signals in the Y direction. Thus, correction steps are made alternately in orthogonal directions. The current collected by the plate 34 below the alignment aperture 32 is maximum when the beam is centered; therefore, the servo 33 will seek the maximum current in two orthogonal directions in the well known "hill climbing" technique. The step size in either orthogonal direction must be smaller than the allowable alignment error because, as previously mentioned, the servo is operated slowly to avoid noise problems.

The analog output voltage from the digital to analog converter 55 is connected to a conventional coil driver 56 in the X yoke driver 40' which provides the deflection current to the X coil 15'. It will be understood, of course, that an identical yoke driver for the Y coil is also provided.

The X offset generator 41' includes a field effect transistor switch 57 controlled by the timing logic 38. An X alignment potentiometer 58 provides the X d.c. offset voltage to the coil driver 56 through the field effect transistor switch 57. In addition, an offset switch 59 controlled by the timing logic 38 and connected to the input of the field effect transistor switch 57 provides continuous alignment positioning for setup.

The manual potentiometer 42' is used to set the center aperture X position is also connected to the coil driver 56. Manual adjustment by means of the manual alignment potentiometer 42' or the offset X alignment potentiometer 58 or their corresponding potentiometers in the Y circuits is facilitated through the current measuring device 48.

The timing logic 38 which synchronizes the servo functions includes an oscillator 60 which may operate at a frequency of 1 kHz, for example. This frequency is not critical, however. The output of oscillator 60 drives a counter and shift register 61 which provide the clock signals for logic 62. Logic 62 also receives as inputs the C cycle and a signal indicating the beginning of the C cycle from the interface equipment 17. The logic 62 provides the sample, stepping and compare pulses illustrated in FIG. 5. In addition, the logic 62 provides the output time delay $t_{s1}$ to allow the beam 11 to settle over the alignment aperture 32. A similar delay $t_{s2}$ is required at the end of the C cycle prior to unblanking the beam 11 to allow the beam to settle in the normal position to the beginning of the next A cycle. The field prior to transistor switch 57 in offset generator 41' is also controlled by the C cycle signal supplied to the logic 62.

It will be obvious to those skilled in the art that a number of variations can be made in the digital servo illustrated in FIG. 4. For example, the forward-backward counter 52 and the digital analog converter 55 could be replaced with an analog staircase generator having an appropriately long holding period.

Figure 6:
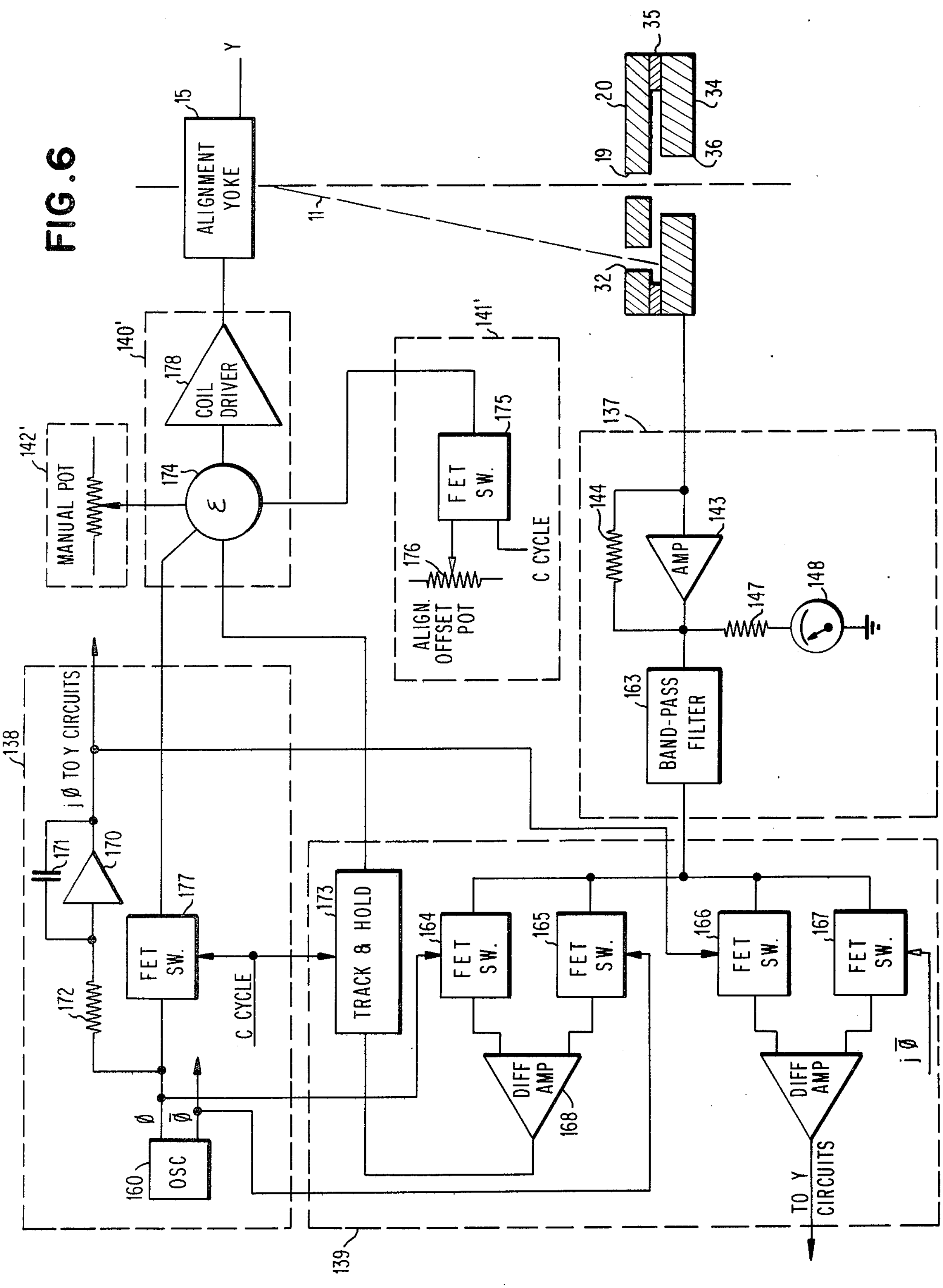
FIG. 6 is a schematic diagram of an analog servo system which may be used alternatively in the implementation of the present invention.

An alternative implementation with an analog servo 33 is illustrated in FIG. 6. As in the preceding implementation, the beam 11 is deflected to the offset alignment aperture 32 in plate 20. The current sensing plate 34 is connected to the input of the error detector 137. The error detector 137 comprises an operational amplifier 143 having a feedback resistor 144 and connected directly to the current measuring plate 34. The output of operational amplifier 143 is connected to a current measuring device 148 through resistor 147. As before, the current measuring device 148 is used to make the required manual adjustments in the alignment. The output of operational amplifier 143 is connected to the input of a bandpass filter 163. The current of the plate 34 is a function of the beam position which is a Gaussian curve. The effect of the bandpass filter 163 is to provide an output which is proportional to the first derivative of the plate current with respect to the beam displacement. Thus, when the beam 11 is in alignment, the output of the bandpass filter 163 is zero. Any deviation from true alignment, however, causes the bandpass filter 163 to have an output, the phase of which is indicative of the direction of misalignment.

The output of bandpass filter 163 is applied to the inputs of field effect transistor switches 164, 165, 166 and 167. Field effect transistor switches 164 and 165 are gated on 180° out of phase by the timing logic 138. In a similar fashion, the field effect transitor switches 166 and 167 are gated on 180° out of phase by the timing logic 38. The switching function, however, of the field effect transistors 164 and 166 are 90° out of phase, while the switching function of the field effect transistor switches 165 and 167 are also 90° out of phase.

The outputs of field effect transistor switches 164 and 165 are connected to the inputs of a low pass differential amplifier 168. The field effect transistor switches 164 and 165 together with the differential amplifier 168 constitute a phase sensitive rectifier which detects the phase of the output of bandpass filter 163 corresponding to the beam displacement in the X direction only. The field effect transistors 166 and 167 have their outputs connected to the input of a low pass differential amplifier 169 and together they form a phase sensitive rectifier which detects out of phase (90°) Y displacement signals only.

The gating signals for the field effect transistor switches 164, 165, 166 and 167 are generated by oscillator 160 and the associated circuitry in the timing logic 138. Oscillator 160 provides a first gating signal designated by $\phi$ in the drawing and a signal 180° out of phase designated by $\overline{\phi}$ in the drawing. A signal 90° out of phase with $\phi$ designated $j\phi$ is generated by an integrator circuit comprising an operational amplifier 170 having a feedback capacitor 171 and an input resistor 172 connected to the $\phi$ output of oscillator 160. This 90° out of phase signal is used to gate the field effect transistor switch 166. It will be understood that a similar integrator circuit is used to derive the $j\overline{\phi}$ signal used to gate the field effect transistor switch 167.

The output error signal from the differential amplifier 168 is supplied to a track and hold circuit 173 which is controlled by the C cycle input. The output of the track and hold circuit is supplied as one input to a summing junction 174 in the X yoke driver circuit 140'. The summing junction 174 also receives as inputs the output of the offset generator 141' and the manual alignment potentiometer 142'. The offset generator 141' comprises a field effect transistor switch 175 controlled by the C cycle to gate a fixed d.c. offset voltage generated by potentiometer 176 to the summing junction 174. The summing junction 174 is itself gated by the output of a field effect transistor switch 177 which is controlled by the C cycle and passes the $\phi$ output from oscillator 160. In the corresponding Y yoke driver circuit, the summing junction would be controlled by the j$\phi$ output of the integrator circuit including operational amplifier 170, again gated by the C cycle.

The output of the summing junction 174 is supplied to the coil driver current amplifier 178 which in turn is connected to the alignment yoke 15.

It may be appreciated from the foregoing description that the analog servo illustrated in FIG. 6 operates in a similar manner to the digital servo shown in FIG. 4. That is, the beam 11 is incrementally displaced in orthogonal directions in order to automatically align the beam. However, both the X and Y servos can operate simultaneously, and this method would have the advantage that most of the gating functions are eliminated.

While the present invention has been described in terms of an apparatus employed to expose the resist on chips of semiconductor wafers, it should be understood that the invention may be employed anywhere that it is desired to correct the alignment of the position of an electron beam. It will therefore be apparent to those skilled in the art that the embodiments shown are only exemplary and that various modifications can be made in construction and arrangement within the scope of the invention as defined in the appended claims.

What is claimed is:

1. In a method of precisely positioning a beam of charged particles including continuously moving the beam through a predetermined path and periodically blanking the beam by deflecting the beam to intercept a blanking plate at a first predetermined position offset from a central aperture in the blanking plate, the improvement of precisely aligning the beam of charged particles with respect to said central aperture during those times when the beam is blanked to correct for instabilities due to lateral beam drift, comprising:
- deflecting the beam toward a second predetermined position on the blanking plate offset from the central aperture;
- sensing the error in alignment of the beam at the second predetermined offset position; and
- correcting the alignment of the beam at the second predetermined offset position to cause the beam to be aligned with respect to the central aperture in the blanking plate when the beam is unblanked.

2. A method of precisely aligning a beam of charged particles as recited in claim 1 wherein the step of correcting includes:
- moving the beam in small increments in two orthogonal directions until the error sensed is reduced to a minimum value.

3. A method of precisely aligning a beam of charged particles as recited in claim 2 wherein the movement of the beam is accomplished by alternate incremental movements in the two orthogonal directions.

4. A method of precisely aligning a beam of charged particles as recited in claim 2 wherein said incremental movements are smaller than the allowable alignment error.

5. In an apparatus for controlling the movement of a beam of charged particles including first deflection means for continuously deflecting the beam in a substantially raster fashion and blanking means including a blanking plate having a central aperture aligned along the normal axis of said beam, said blanking means deflecting said beam in a blanking made to intercept said blanking plate at a first predetermined position offset from said central aperture the improvement for precisely aligning said beam of charged particles with respect to said central aperture to correct for instabilities due to lateral beam drift, comprising:
- second deflecting means for deflecting said beam in said blanking made toward a second predetermined position on said blanking plate offset from said central aperture;
- means for sensing the error in alignment of said beam at said second predetermined offset position; and
- servo means responsive to said sensing means and controlling said second deflecting means for correcting the alignment of said beam at said second predetermined offset position with the result that alignment of said beam at said second predetermined offset position causes said beam to be aligned along its normal axis.

6. An apparatus for precisely aligning a beam of charged particles as recited in claim 5 wherein said correcting means includes means for moving the beam in small increments in two orthogonal directions until the alignment error sensed by said sensing means is reduced to a minimum value.

7. An apparatus for precisely aligning a beam of charged particles as recited in claim 6 wherein said moving means is operable to move the beam in alternate incremental movements in the two orthogonal directions.

8. An apparatus for precisely aligning a beam of charged particles as recited in claim 6 wherein the small increments that the beam is moved by said moving means are smaller than the allowable alignment error.

9. An apparatus for precisely aligning a beam of charged particles as recited in claim 5 wherein said blanking plate is provided with an
- auxiliary aperture at said second predetermined offset position and said sensing means comprises:
- a second plate having a central aperture aligned with the axis of said beam in its normal mode, said second plate being separated from said blanking plate but closely spaced thereto to intercept the beam passing through said auxiliary aperture when the beam is deflected toward said second predetermined offset position; and
- detecting means connected to said second plate for generating a signal proportional to the beam current intercepted thereby.

10. An apparatus for precisely aligning a beam of charged particles as recited in claim 9 wherein said correcting means comprises:
- means for incrementally moving said beam along the line of a first of two orthogonal directions;
- means responsive to said detecting means for controlling the direction of movement of said beam in said first line;
- means for incrementally moving said beam along a second line orthogonal to said first line; and
- means responsive to said detecting means for controlling the direction of movement of said beam along said second line.

11. An apparatus for precisely aligning a beam of charged particles as recited in claim 10 wherein said means for controlling the direction of movement of said beam in said first line comprises a first bistable device the state of which determines the direction of movement in said first line, and said means for controlling the direction of movement of said beam in said second line comprises a second bistable device the state of which determines the direction of movement in said second line.

12. An apparatus for precisely aligning a beam of charged particles as recited in claim 11 wherein said sensing means further comprises:

storage means for sampling and holding a voltage proportional to the output of said signal generating means, and comparator means connected to both said signal generating means and said storage means and responsive thereto for generating an output which controls the state of both of said first and second bistable devices.

13. An apparatus for precisely aligning a beam of charged particles as recited in claim 12 wherein said means for controlling includes:

first counting means controlled by said first bistable device for counting in one or the other of two directions, second counting means controlled by said second bistable device for counting in one or the other of two directions, first analog to digital converter means connected to said first counting means for generating a first correcting voltage proportional to the counts accumulated by said first counting means, said first correcting voltage being supplied to said correcting means for correcting the alignment in one of said two orthogonal directions, and second analog to digital converter means connected to said second counting means for generating a second correcting voltage proportional to the count accumulated by said second counting means, said second correcting voltage being supplied to said correcting means for correcting the alignment in the other of said two orthogonal directions.

14. An apparatus for precisely aligning a beam of charged particles as recited in claim 9 wherein said sensing means includes means for generating a signal proportional to the first derivative of the beam current intercepted by said second plate.

15. An apparatus for precisely aligning a beam of charged particles as recited in claim 14 wherein said correcting means comprises:

means for incrementally moving said beam along the line of a first of two orthogonal directions;

means responsive to said detecting means for controlling the direction of movement of said beam in said first line;

means for incrementally moving said beam along a second line orthogonal to said first line; and means responsive to said deflector means for controlling the direction of movement of said beam along said second line.

16. An apparatus for precisely aligning a beam of charged particles as recited in claim 15 wherein said means for controlling the direction of movement of said beam in said first line comprises a first phase sensitive detector the output phase of which determines the direction of movement in said first line, and said means for controlling the direction of movement in said second line comprises a second phase sensitive detector the output phase of which determines the direction of movement in said second line.

17. An apparatus for precisely aligning a beam of charged particles as recited in claim 16 further comprising:

first storage means connected to said first phase sensitive detector for storing a voltage indicative of the output thereof and supplying a correcting voltage for aligning said beam in said first direction, and second storage means connected to said second phase sensitive detector for storing a voltage indicative of the output thereof and supplying a correcting voltage for aligning said beam in a second orthogonal direction.

* * * * *

UNITED STATES PATENT OFFICE

CERTIFICATE OF CORRECTION

PATENT NO. : 3,894,271

DATED : July 8, 1975

INVENTOR(S) : Hans C. Pfeiffer, Ollie C. Woodward

It is certified that error appears in the above-identified patent and that said Letters Patent are hereby corrected as shown below:

IN THE CLAIMS:

Column 10, lines 41-42: "auxiliary aperture at said second predetermined offset position and said sensing means comprises:"

should be part of the preceding paragraph.

Signed and Sealed this

*fourteenth* Day of *October 1975*

[SEAL]

*Attest:*

RUTH C. MASON
*Attesting Officer*

C. MARSHALL DANN
*Commissioner of Patents and Trademarks*